United States Patent
Lee et al.

(10) Patent No.: US 8,643,089 B2
(45) Date of Patent: Feb. 4, 2014

(54) SEMICONDUCTOR DEVICE AND FABRICATING METHOD THEREOF

(75) Inventors: Tsung-Hsiung Lee, Taoyuan County (TW); Shang-Hui Tu, Tainan (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 13/419,464

(22) Filed: Mar. 14, 2012

(65) Prior Publication Data

US 2013/0175607 A1      Jul. 11, 2013

(30) Foreign Application Priority Data

Jan. 5, 2012   (TW) .............................. 101100416 A

(51) Int. Cl.
*H01L 29/66* (2006.01)
*H01L 21/336* (2006.01)

(52) U.S. Cl.
USPC .......................................... 257/329; 438/268

(58) Field of Classification Search
USPC ................. 257/332, 333, E29.022, E29.146, 257/E29.198, E29.257
See application file for complete search history.

(56) References Cited

U.S. PATENT DOCUMENTS

| | | | | |
|---|---|---|---|---|
| 6,184,555 | B1 * | 2/2001 | Tihanyi et al. | 257/342 |
| 2009/0140330 | A1 * | 6/2009 | Yagi et al. | 257/330 |
| 2011/0278642 | A1 * | 11/2011 | Tu | 257/130 |
| 2011/0298045 | A1 * | 12/2011 | Kalnitsky et al. | 257/331 |

* cited by examiner

*Primary Examiner* — Julio J Maldonado
*Assistant Examiner* — Moin Rahman
(74) *Attorney, Agent, or Firm* — Birch, Stewart, Kolasch & Birch, LLP

(57) ABSTRACT

A semiconductor device is provided. The semiconductor device includes a substrate having a first doping region and an overlying second doping region, wherein the first and second doping regions have a first conductivity type and wherein the second doping region has at least one first trench and at least one second trench adjacent thereto. A first epitaxial layer is disposed in the first trench and has a second conductivity type. A second epitaxial layer is disposed in the second trench and has the first conductivity type, wherein the second epitaxial layer has a doping concentration greater than that of the second doping region and less than that of the first doping region. A gate structure is disposed on the second trench. A method of fabricating a semiconductor device is also disclosed.

14 Claims, 11 Drawing Sheets

SEMICONDUCTOR DEVICE AND FABRICATING METHOD THEREOF

CROSS REFERENCE TO RELATED APPLICATIONS

This application claims priority of Taiwan Patent Application No. 101100416, filed on Jan. 5, 2012, the entirety of which is incorporated by reference herein.

BACKGROUND OF THE INVENTION

1. Field of the Invention

The invention relates to a semiconductor device, and in particular to a semiconductor device having a super junction structure and a fabricating method thereof.

2. Description of the Related Art

FIG. 1 illustrates a cross section of a conventional N-type vertical double-diffused MOSFET (VDMOSFET). The VDMOSFET 10 includes a semiconductor substrate and a gate structure thereon. The semiconductor substrate has an N-type epitaxial drift region 100 and a P-type base region 102 thereon to form a P-N junction. Moreover, a drain region 106 is under the N-type epitaxial drift region 100 and is connected to a drain electrode 114. The P-type base region 102 has a source region 104 therein and is connected to a source electrode 112. The gate structure is constituted by a gate dielectric layer 108 and a gate electrode 110 thereon.

In order to increase the withstand voltage of the P-N junction in the VDMOSFET 10, it is required to reduce the doping concentration of the N-type epitaxial drift region 100 and/or increase the thickness thereof. However, when the withstand voltage of the P-N junction is increased by such an approach, the turn on resistance (Ron) of the VDMOSFET 10 must be increased. Namely, the turn on resistance is limited by the doping concentration and the thickness of the N-type epitaxial drift region 100.

A VDMOSFET having a super junction structure may increase the doping concentration of the N-type epitaxial drift region so as to increase the withstand voltage of the P-N junction, while being capable of preventing the turn on resistance from increasing. In a conventional art, the super junction structure is formed by a multi-epi technology. Such a multi-epi technology requires repeatedly performing the epitaxial growth, P-type doping and high temperature diffusion processes, and therefore the multi-epi technology has drawbacks such as having complicated processes, high manufacturing costs and having a hard time when trying to miniaturize the device size.

Accordingly, there exists a need in the art for development of a semiconductor device having a super junction structure, capable of mitigating or eliminating the aforementioned problems.

BRIEF SUMMARY OF THE INVENTION

A detailed description is given in the following embodiments with reference to the accompanying drawings. Semiconductor devices and methods for fabricating the same are provided. An exemplary embodiment of a semiconductor device comprises a substrate having a first doping region and an overlying second doping region, wherein the first and second doping regions have a first conductivity type and wherein the second doping region has at least one first trench and at least one second trench adjacent thereto. A first epitaxial layer is disposed in the first trench and has a second conductivity type. A second epitaxial layer is disposed in the second trench and has the first conductivity type, wherein the second epitaxial layer has a doping concentration greater than that of the second doping region and less than that of the first doping region. A gate structure is disposed on the second trench.

An exemplary embodiment of a method of fabricating semiconductor device comprises providing a substrate having a first doping region and an overlying second doping region, wherein the first and second doping regions have a first conductivity type. At least one first trench is formed in the second doping region. A first epitaxial layer is formed in the first trench, wherein the first epitaxial layer has a second conductivity type. At least one second trench is formed in the second doping region and adjacent to the first trench. A second epitaxial layer is formed in the second trench, wherein the second epitaxial layer has the first conductivity type and has a doping concentration greater than that of the second doping region and less than that of the first doping region. A gate structure is formed on the second trench.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is provided for the purpose of illustrating the general principles of the invention and should not be taken in a limiting sense. The scope of the invention is best determined by reference to the appended claims.

Figure 1:
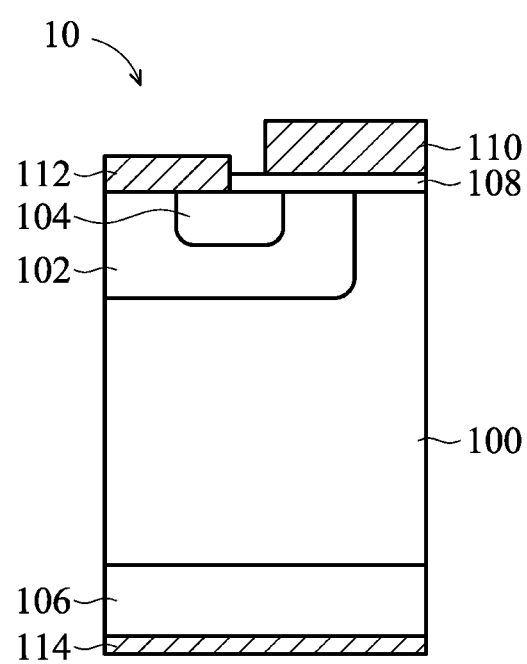
FIG. 1 is a cross section of a conventional N-type vertical double-diffused MOSFET (VDMOSFET).
Figure 2A:
FIGS. 2A to 2G are cross sections of an embodiment of a method of fabricating a semiconductor device according to the invention.
Figure 2B:
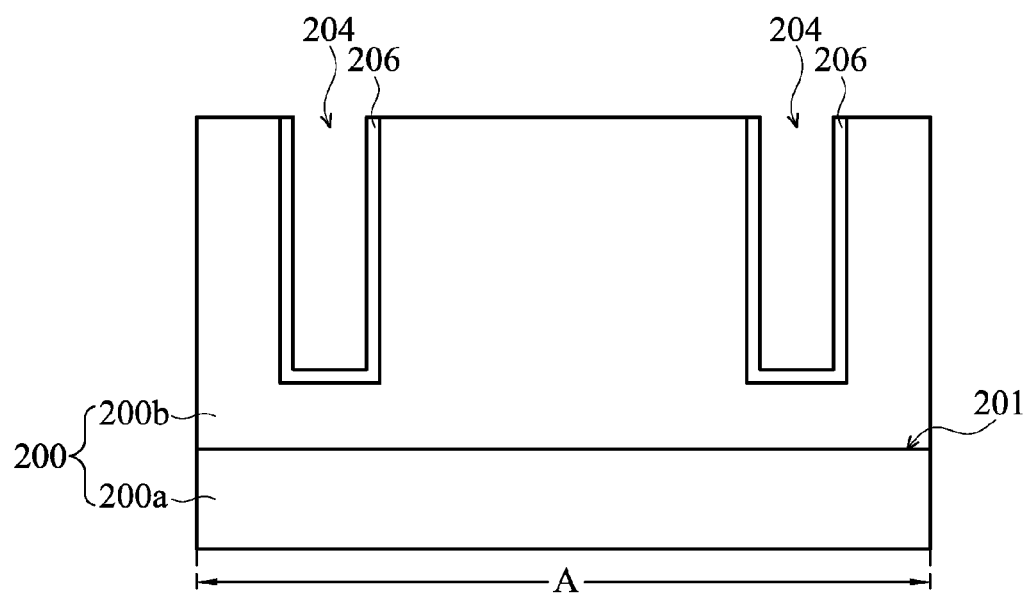
Figure 2C:
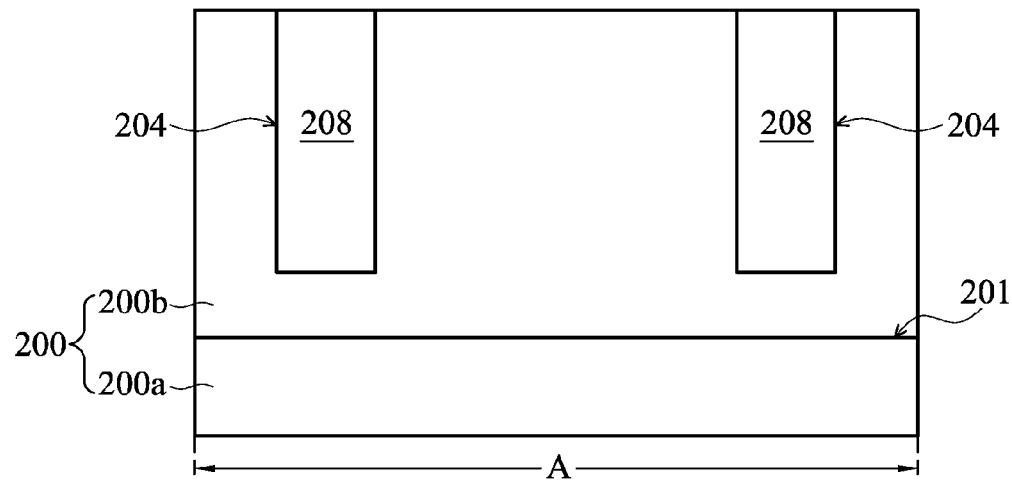
Figure 2D:
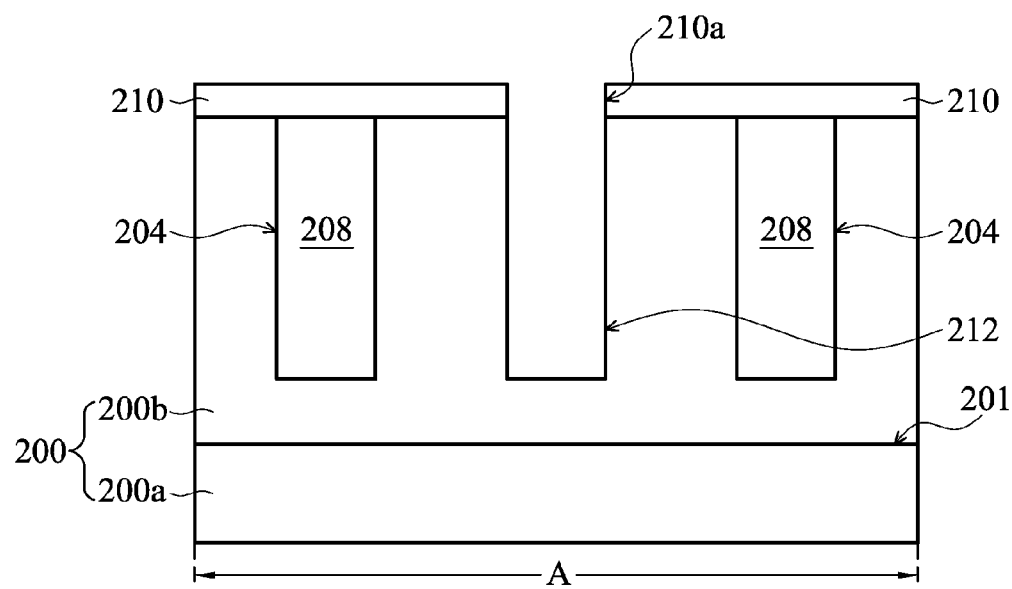
Figure 2E:
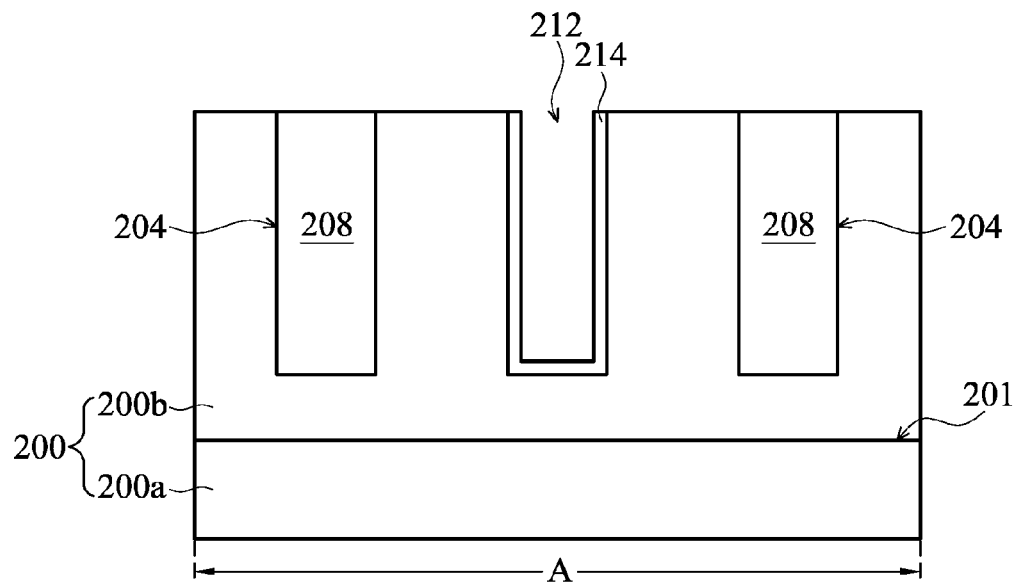
Figure 2F:
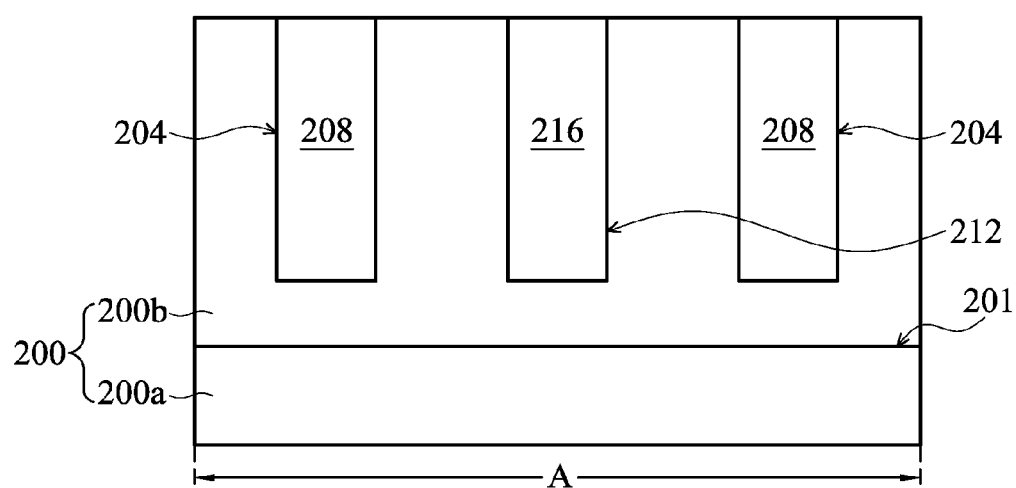
Figure 2G:
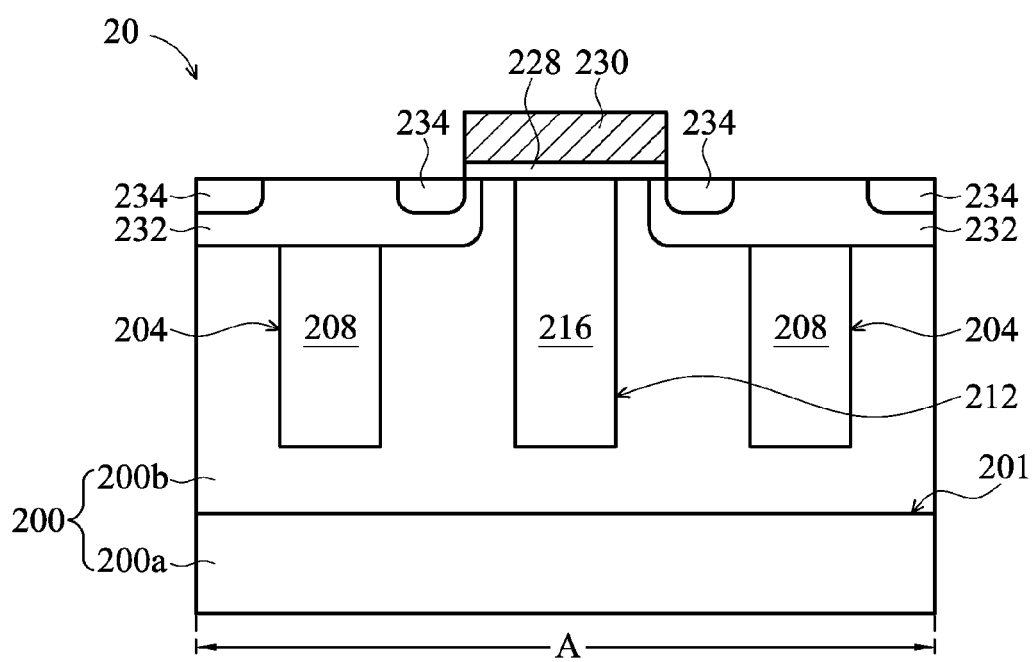

FIG. 2G illustrates a cross section of an embodiment of a semiconductor device according to the invention. In the embodiment, a semiconductor device 20 may comprise a VDMOSFET having a super junction structure. The semiconductor device 20 comprises a substrate 200 having a first doping region 200a and a second doping region 200b on the first doping region 200a, wherein the first and second doping regions 200a and 200b have an interface 201 therebetween. As shown in FIG. 2G, the substrate 200 may comprise an active region A and a termination region (not shown) encircling the active region A. In one embodiment, the active region A is provided for forming semiconductor elements/devices thereon, and the termination region is provided for isolation between the semiconductor elements/devices. In one embodiment, the first doping region 200a is formed of a semiconductor material and the second doping region 200b is formed of a doped epitaxial layer. In another embodiment, the first and second doping regions 200a and 200b with different doping concentrations are formed in the same semiconductor material substrate 200. In the embodiment, the first and second doping regions 200a and 200b have a first type conductivity, wherein the first doping region 200a may be a heavily doped region and the second doping region 200b may be a lightly doped region.

The second doping region 200b comprises pluralities of first and second trenches 204 and 212 therein, wherein the pluralities of first and second trenches 204 and 212 are in an alternate arrangement, such that each second trench 212 is adjacent to at least one first trench 204 or each first trench 204 is adjacent to at least one second trench 212. Here, in order to simplify the diagram, only a second trench 212 and two first trenches 204 adjacent thereto are depicted. In the embodiment, the bottoms of the first and second trenches 204 and 212 are above the interface 201 between the first and second doping regions 200a and 200b. In another embodiment, however, the first and second trenches 204 and 212 may expose the interface 201 between the first and second doping regions 200a and 200b.

A first epitaxial layer 208 is disposed in the first trench 204 and has a second conductivity type. The first epitaxial layer 208 has a doping concentration greater than that of the second doping region 200b and less than that of the first doping region 200a. A second epitaxial layer 216 is disposed in the second trench 212 and has the first conductivity type. The second epitaxial layer 216 has a doping concentration greater than that of the second doping region 200b and less than that of the first doping region 200a.

In the embodiment, the first conductivity type is N-type and the second conductivity type is P-type. In some embodiments, however, the first conductivity type may also be P-type and the second conductivity type may be N-type. As a result, the first epitaxial layer 208 having the second conductivity type and the second epitaxial layer 216 having the first conductivity type may form a super junction structure in the second doping region 200b.

A gate structure, which comprises a gate dielectric layer 228 and an overlying gate electrode 230, is disposed on the second trench 212. Moreover, a well region 232 having the second conductivity type is formed in an upper portion of each first epitaxial layer 208 and extends into the second doping region 200b outside of the first epitaxial layer 208. A source region 234 having the first conductivity type is formed in each well region 232 on both sides of the gate structure to form a VDMOSFET with the gate structure and the first doping region (which serves as a drain region) 200a.

Figure 3A:
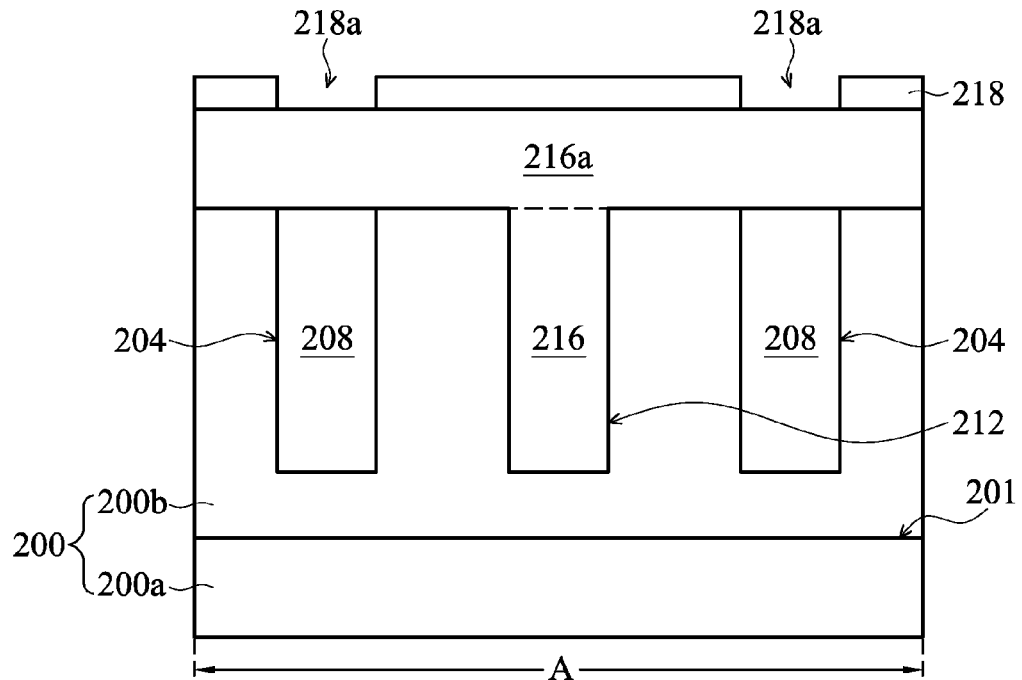
FIGS. 3A to 3E are cross sections of another embodiment of a method of fabricating a semiconductor device according to the invention.
Figure 3B:
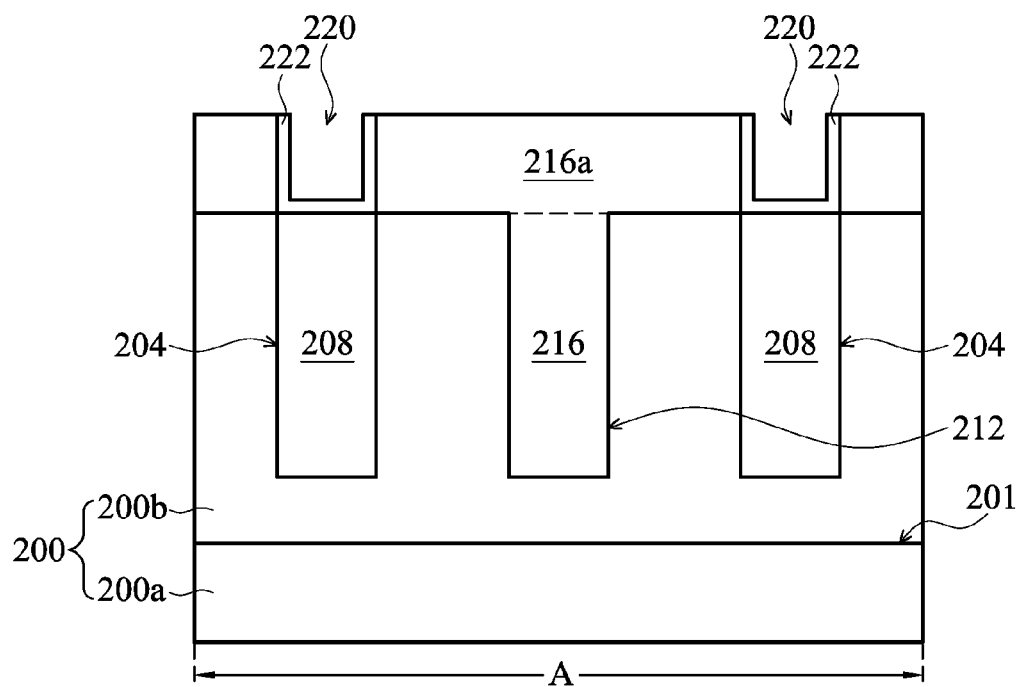
Figure 3C:
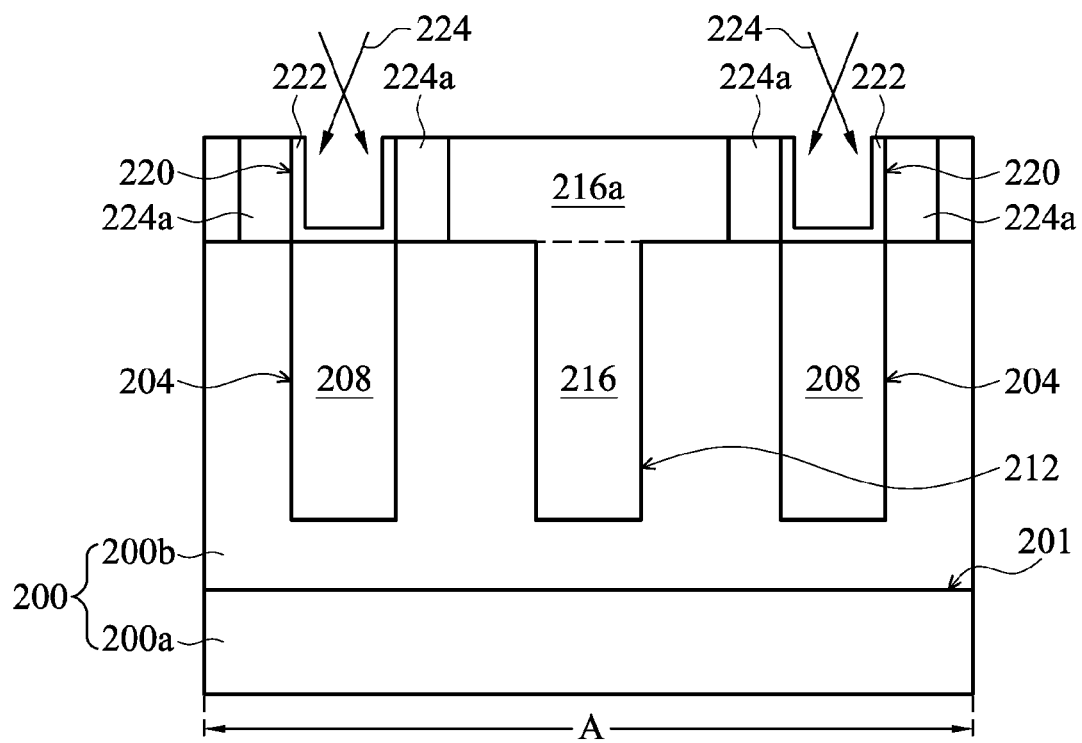
Figure 3D:
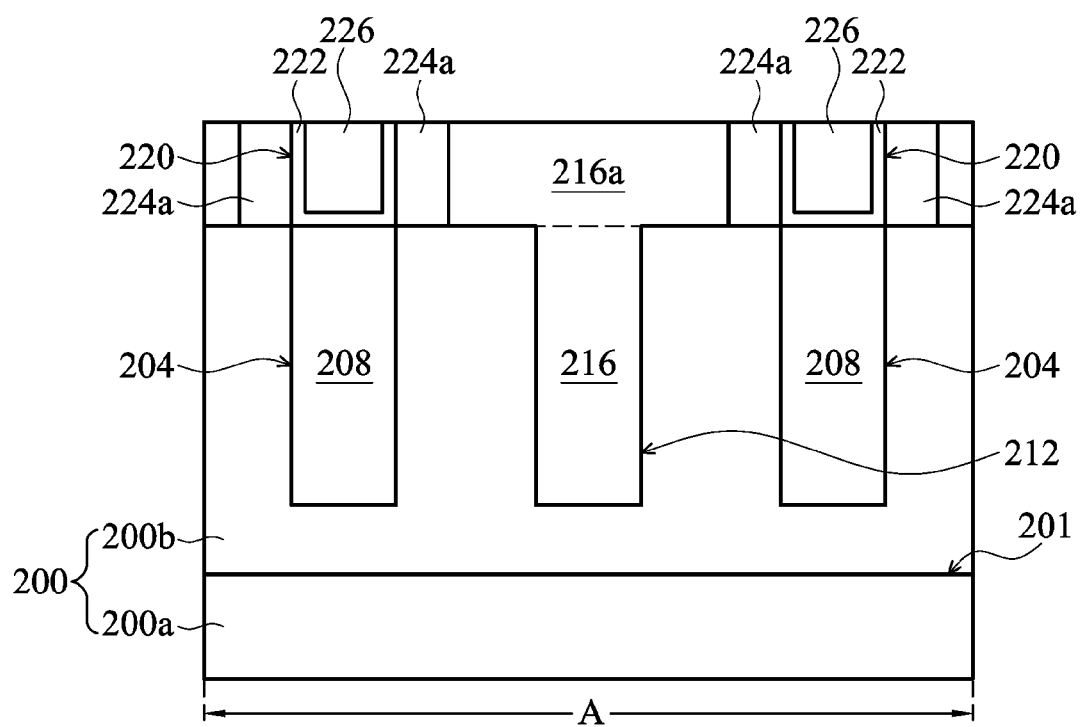
Figure 3E:
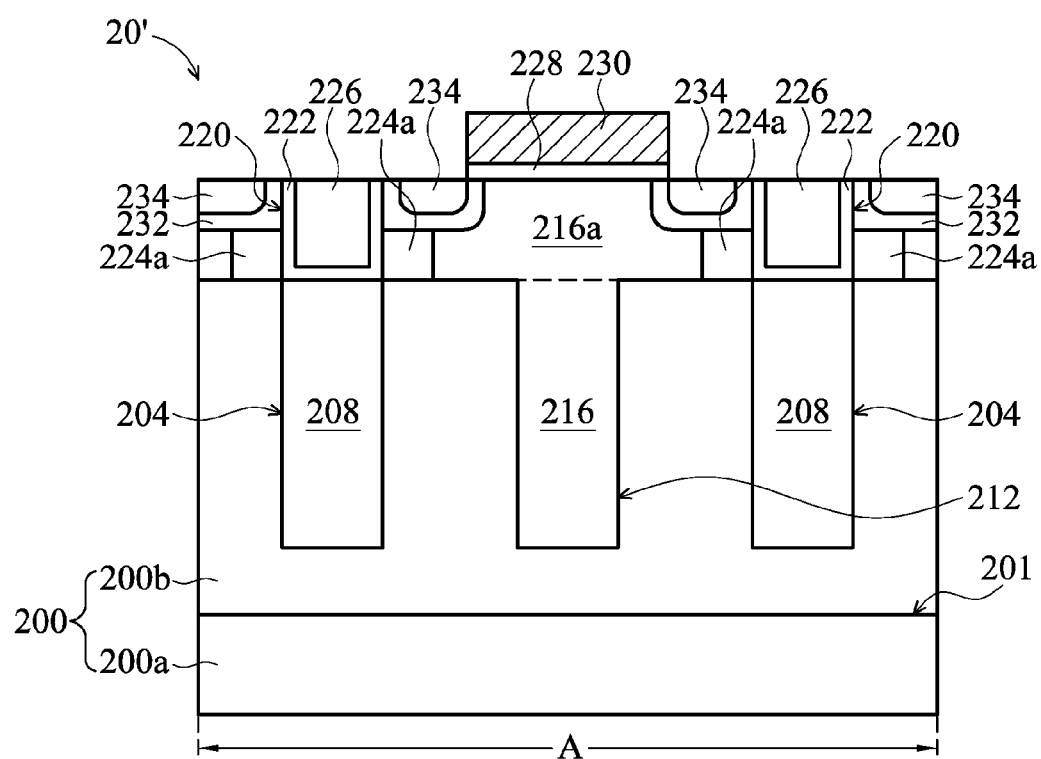

FIG. 3E illustrates a cross section of another embodiment of a semiconductor device according to the invention. Elements in FIG. 3E that are the same as those in FIG. 2G are labeled with the same reference numbers as in FIG. 2G and are not described again for brevity. In the embodiment, the second epitaxial layer 216 in the semiconductor device 20' may further comprise an extending portion 216a on the substrate 200 to cover the second doping region 200b. Particularly, the extending portion 216a of the second epitaxial layer 216 corresponding to each first trench 204 has a third trench 220 therein, to expose the first epitaxial layer 208. Moreover, the extending portion 216a of the second epitaxial layer 216 has a third doping region 224a adjacent to a sidewall of each third trench 220, wherein the third doping region 224a has the second conductivity type. In the embodiment, the third doping region 224a has a doping concentration greater than that of the second doping region 200b and less than that of the first doping region 200a. As a result, the third doping region 224a having the second conductivity type and the extending portion 216a having the first conductivity type also form a super junction structure.

An insulating liner 222 and a dielectric material layer 226 are disposed in each third trench 220. In one embodiment, the insulating liner 222 may comprise silicon oxide and the dielectric material layer 226 may comprise silicon oxide or undoped polysilicon.

In the embodiment, the gate structure is disposed on the extending portion 216a and corresponding to the second trench 212. Moreover, the well region 232 is formed in an upper portion of each third doping region 224a and extends into the extending portion 216a outside of the third doping region 224a. The source region 234 having the first conductivity type is formed in each well region 232 on both sides of the gate structure to form a VDMOSFET with the gate structure and the first doping region (which serves as a drain region) 200a.

Figure 4A:
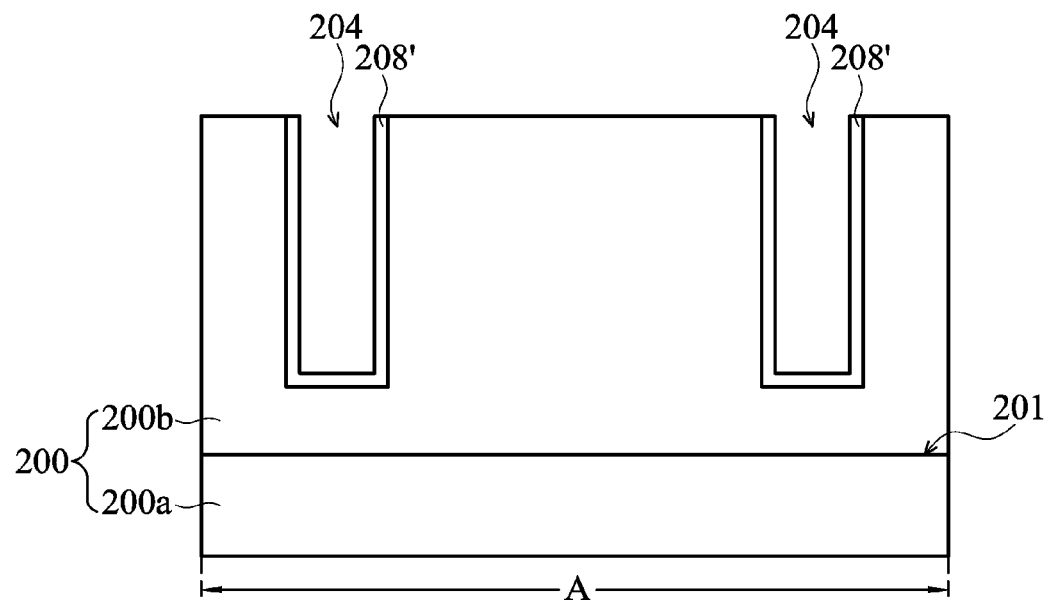
FIGS. 4A to 4F are cross sections of yet another embodiment of a method of fabricating a semiconductor device according to the invention.
Figure 4B:
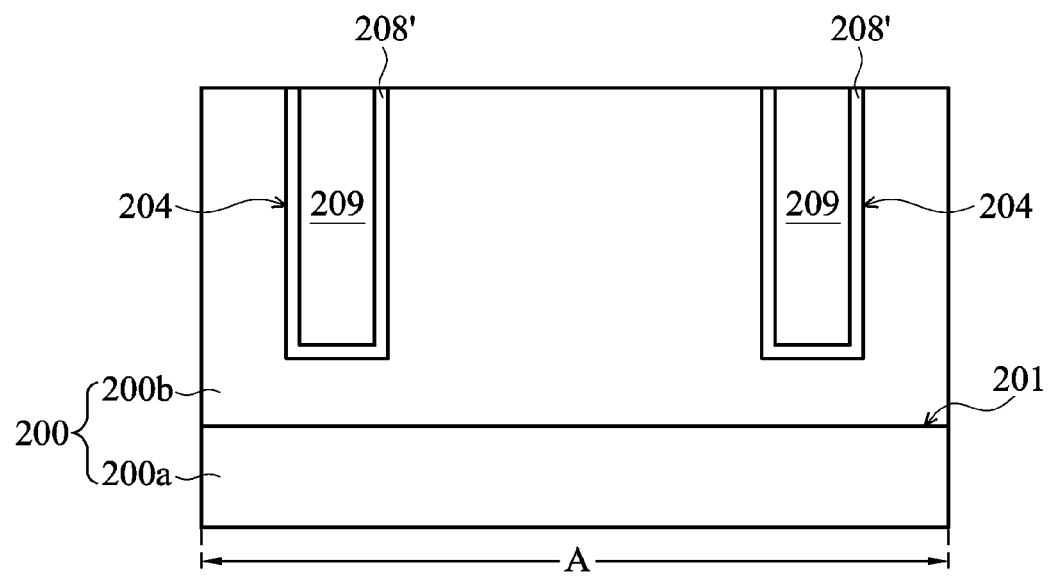
Figure 4C:
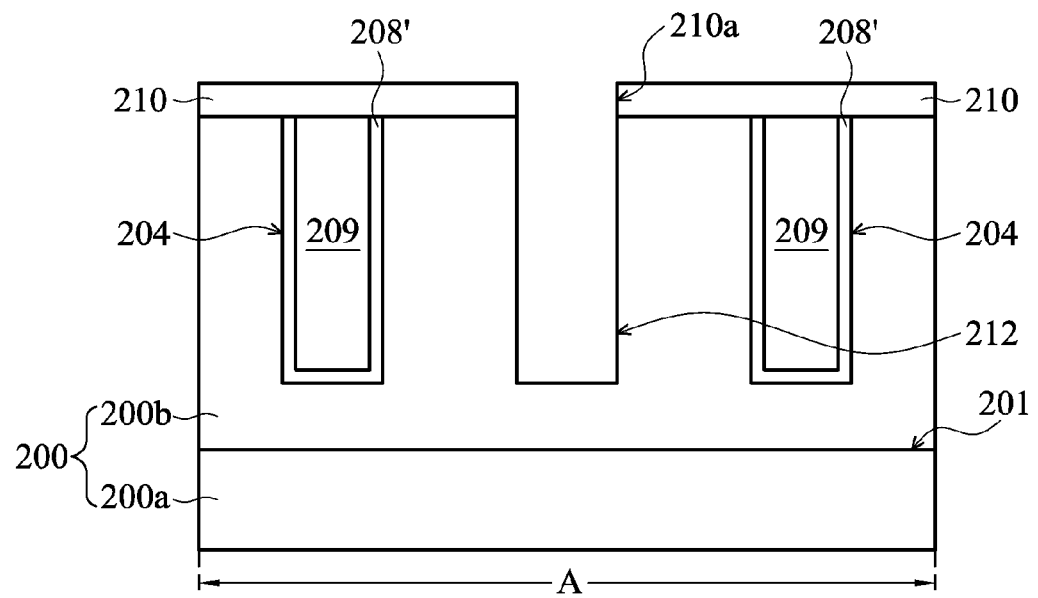
Figure 4D:
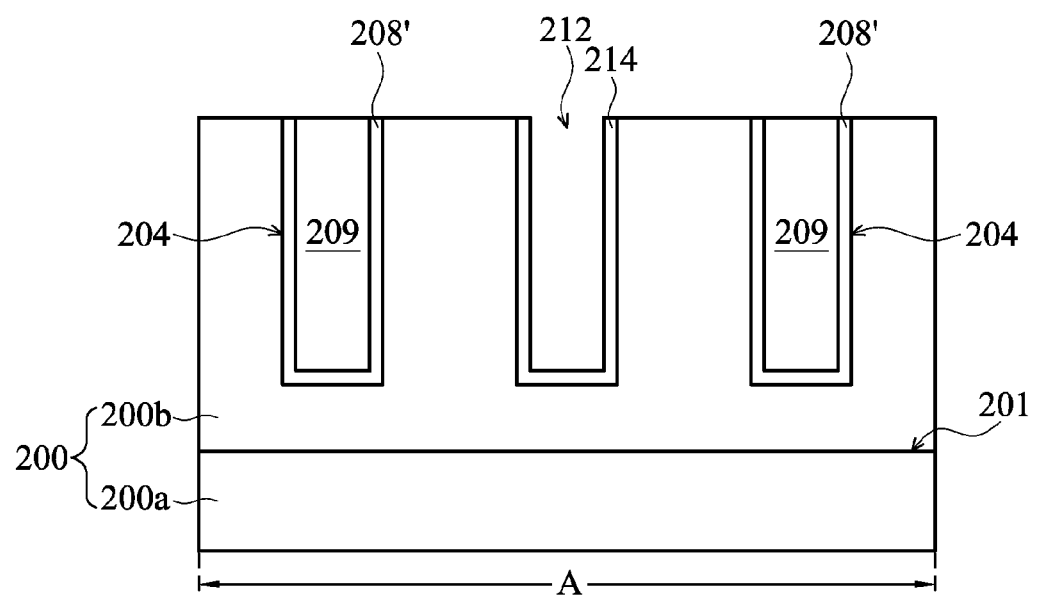
Figure 4E:
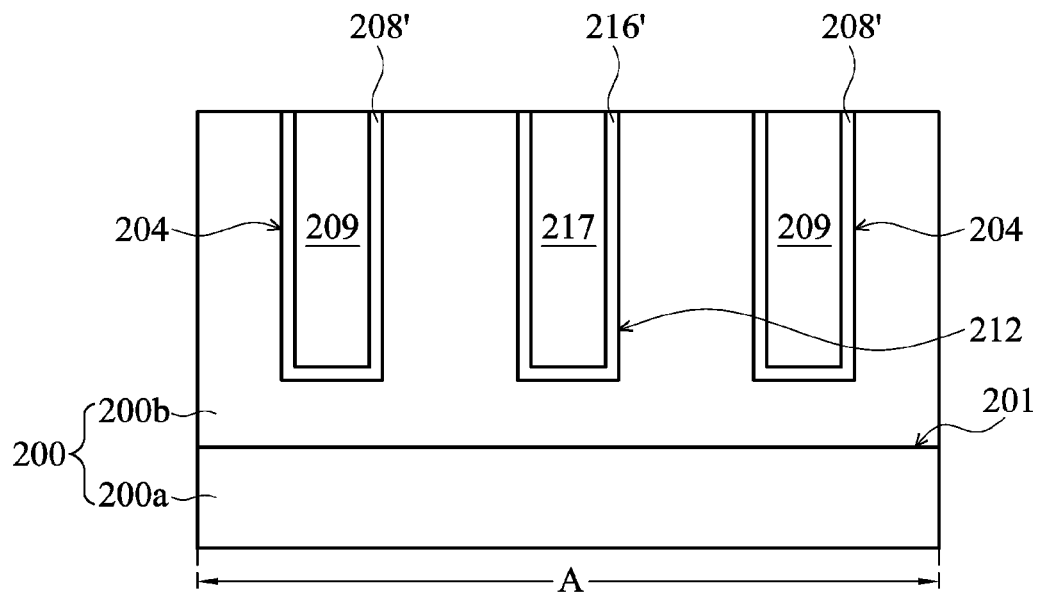
Figure 4F:
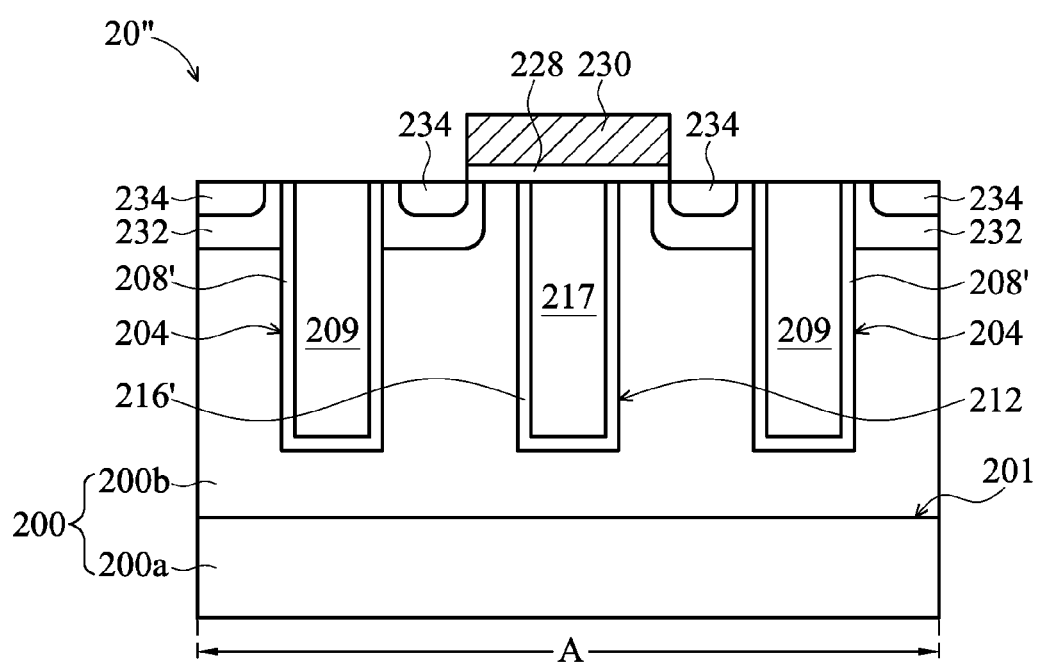

FIG. 4F illustrates a cross section of yet another embodiment of a semiconductor device according to the invention. Elements in FIG. 4F that are the same as those in FIG. 2G are labeled with the same reference numbers as in FIG. 2G and are not described again for brevity. In the embodiment, the first epitaxial layer 208' and the second epitaxial layer 216' in the semiconductor device 20" partially fills the first trench 204 and the second trench 212, respectively. For example, the first epitaxial layer 208' is conformably disposed on the bottom and the sidewall of the first trench 204, and the second epitaxial layer 216' is conformably disposed on the bottom and the sidewall of the second trench 212. Moreover, dielectric material layers 209 and 217 are disposed in the first and second trenches 204 and 212, respectively, to fully fill the first and second trenches 204 and 212. In one embodiment, dielectric material layers 209 and 217 may comprise silicon oxide or undoped polysilicon. As a result, the first epitaxial layer 208' having the second conductivity type and the second epitaxial layer 216' having the first conductivity type form a super junction structure in the second doping region 200b.

In the embodiment, the well region 232 is formed in an upper portion of each first epitaxial layer 208' and extends into the second doping region 200b outside of the first epitaxial layer 208'. The source region 234 having the first conductivity type is formed in each well region 232 on both sides of the gate structure to form a VDMOSFET with the gate structure and the first doping region (which serves as a drain region) 200a.

FIGS. 2A to 2G are cross sections of an embodiment of a method of fabricating a semiconductor device 20 according to the invention. Referring to FIG. 2A, a substrate 200 is provided. The substrate 200 has a first doping region 200a and an overlying second doping region 200b, wherein the first and second doping regions 200a and 200b has an interface 201 therebetween. The substrate 200 may comprise an active region A and a termination region (not shown) encircling the active region A. In one embodiment, the first doping region 200a is formed of a semiconductor material and the second doping region 200b is formed of a doped epitaxial layer on the semiconductor material (i.e., the first doping region 200a) by an epitaxial growth process. In another embodiment, different doping processes may be performed on the substrate 200 formed of a semiconductor material, thereby forming the first and second doping regions 200a and 200b with different doping concentrations therein, wherein the doping process for formation of the first doping region 200a may be performed after formation of a transistor structure. In the embodiment, the first and second doping regions 200a and 200b have a first type conductivity, wherein the first doping region 200a may be a heavily doped region and the second doping region 200b may be a lightly doped region.

Next, referring to FIGS. 2A and 2B, a plurality of first trenches 204 is formed. A hard mask (HM) 202 is formed on the substrate 200 by, for example, a chemical vapor deposition (CVD) process, and thereafter lithography and etching processes are performed on the hard mask 202, thereby forming a plurality of openings 202a for definition of the first trenches 204 in the hard mask 202 in the active region A. Next, an anisotropic etching process is performed, so as to form a plurality of first trenches 204 in the second doping region 200b under the plurality of openings 202a. In the embodiment, the bottoms of the plurality of first trenches 204 are above the interface 201 between the first and second doping regions 200a and 200b (e.g., close to the interface 201). In another embodiment, however, the plurality of first trenches 204 may expose the interface 201 between the first and second doping regions 200a and 200b.

In the embodiment, after removal of the hard mask 202, an insulating liner 206 is conformably formed on the sidewall and bottom of each first trench 204 by a CVD or thermal oxidation process. In one embodiment, the insulating liner 206 may be an oxide liner which is capable of reducing the stresses in the second doping region 200b.

Referring to FIG. 2C, after removal of the insulating liner 206, a first epitaxial layer 208 having a second conductivity type is filled into each first trench 204. The first epitaxial layer 208 has a doping concentration greater than that of the second doping region 200b and less than that of the first doping region 200a. For example, a first epitaxial layer 208 is formed on the substrate 200 and fills each first trench 204 by an epitaxial growth process. Thereafter, the first epitaxial layer 208 on the substrate 200 may be removed by a polishing process, such as chemical mechanical polishing (CMP). In the embodiment, the first conductivity type is N-type and the second conductivity type is P-type. In another embodiment, however, the first conductivity type may be P-type and the second conductivity type may be N-type.

Referring to FIGS. 2D to 2E, a plurality of second trenches 212 are formed. A hard mask 210, which comprises a material and is formed by a method similar or the same as that of the hard mask 202 (as shown in FIG. 2A), is formed on the substrate 200. Thereafter, a plurality of openings 210a for definition of the plurality of second trenches 212 are formed in the hard mask 202 in the active region A. Next, an anisotropic etching process is performed, so as to form a plurality of second trenches 212 in the second doping region 200b under the plurality of openings 210a. The pluralities of second and first trenches 212 and 204 are alternately arranged, such that each second trench 212 is adjacent to at least one first trench 204 or each first trench 204 is adjacent to at least one second trench 212. Here, in order to simplify the diagram, only a second trench 212 and two first trenches 204 adjacent thereto are depicted, as shown in FIG. 2D.

In the embodiment, after removal of the hard mask 210, an insulating liner 214 is conformably formed on the sidewall and bottom of each second trench 212, thereby reducing the stresses in the second doping region 200b, as shown in FIG. 2E. The insulating liner 214 may comprise a material and be formed by a method similar or the same as that of the insulating liner 206 (as shown in FIG. 2B).

Referring to FIG. 2F, after removal of the insulating liner 214, a second epitaxial layer 216 having the first conductivity type is filled into each second trench 212. The second epitaxial layer 216 has a doping concentration greater than that of the second doping region 200b and less than that of the first doping region 200a. The second epitaxial layer 216 may comprise a material and be formed by a method similar or the same as that of the first epitaxial layer 208 (as shown in FIG. 2C). As a result, the first epitaxial layer 208 having the second conductivity type and the second epitaxial layer 216 having the first conductivity type form a super junction structure in the second doping region 200b.

Referring to FIG. 2G, a gate structure is formed on each second trench 202 by the conventional MOS process. The gate structure may comprise a gate dielectric layer 228 and an overlying gate electrode 230. Moreover, a well region 232 having the second conductivity type is formed on an upper portion of each first epitaxial layer 208 and extends into the second doping region 200b outside of the first epitaxial layer 208. A source region 234 having the first conductivity type is formed in each well region 232 on both sides of the gate structure to complete the fabrication of the semiconductor device 20, wherein a VDMOSFET is constituted by the source region 234, the gate structure and the first doping region (which serves as a drain region) 200a.

FIGS. 3A to 3E are cross sections of another embodiment of a method of fabricating a semiconductor device according to the invention. Elements in FIGS. 3A to 3E that are the same as those in FIGS. 2A to 2G are labeled with the same reference numbers as in FIGS. 2A to 2G and are not described again for brevity. Referring to FIG. 3A, a substrate 200 is provided. The substrate 200 may comprise an active region A and a termination region (not shown) encircling the active region A. Moreover, the substrate 200 has a first doping region 200a and a second doping region 200b on the first doping region 200a, wherein the first and second doping regions 200a and 200b have a first conductivity type. The first and second doping regions 200a and 200b have an interface 201 therebetween. The second doping region 200b comprises pluralities of first and second trenches 204 and 212 therein, wherein the pluralities of first and second trenches 204 and 212 are in an alternate arrangement, such that each second trench 212 is adjacent to at least one first trench 204 or each first trench 204 is adjacent to at least one second trench 212. Here, in order to simplify the diagram, only a second trench 212 and two first trenches 204 adjacent thereto are depicted. A first epitaxial layer 208 having a second conductivity type is disposed in each first trench 204. In one embodiment, such a structure may be formed by the fabricating steps shown in FIGS. 2A to 2E.

Next, a second epitaxial layer 216 having the first conductivity type is filled into each second trench 212 and extends onto the substrate 200 from each second trench 212, to form a extending portion 216a which covers the second doping region 200b, as shown in FIG. 3A.

Referring to FIGS. 3A to 3B, a plurality of third trenches 220 are formed. A hard mask 218, which comprises a material and is formed by a method similar or the same as that of the hard mask 210 (as shown in FIG. 2A), is formed on the extending portion 216a. Thereafter, a plurality of openings 218a for definition of the plurality of third trenches 220 are formed in the hard mask 218 in the active region A. Next, an anisotropic etching process is performed, so as to form a plurality of third trenches 220 in the second epitaxial layer 216 (i.e., the extending portion 216a) under the plurality of openings 218a. The pluralities of third trenches 220 is substantially aligned to the plurality of first trenches 204 and exposes the first epitaxial layer 208 in the first trench 204, as shown in FIG. 3B.

Referring to FIG. 3B again, in the embodiment, after removal of the hard mask 218, an insulating liner 222 is conformably formed on the sidewall and bottom of each third trench 220, thereby reducing the stresses in the extending portion 216a and serving as a pre-implant oxide for a subsequent doping process to reduce the channel effect. The insulating liner 222 may comprise a material and be formed by a method similar or the same as that of the insulating liner 206 (as shown in FIG. 2B).

Referring to FIG. 3C, a doping process 224, such as an ion implantation process, is performed in the extending portion 216a of the second epitaxial layer 216, thereby forming a plurality of third doping regions 224a therein, wherein each third doping region 224a is adjacent to a sidewall of each third trench 220 and has the second conductivity type. In the embodiment, the third doping region 224a has a doping concentration greater than that of the second doping region 200b and less than that of the first doping region 200a. As a result, the third doping region 224a having the second conductivity type and the extending portion 216a of the second epitaxial layer 216 having the first conductivity type form a supper junction structure.

Referring to FIG. 3D, a dielectric material layer 226 is filled into each third trench 220. For example, a dielectric material layer 226, such as silicon oxide or undoped polysilicon, is formed on the extending portion 216a of the second epitaxial layer 216 and in each third trench 220 by a CVD process. Thereafter, the dielectric material layer 226 on the extending portion 216a of the second epitaxial layer 216 is removed by a CMP process.

Referring to 3E, a gate structure is formed on the extending portion 216a of the second epitaxial layer 216 on each second trench 202 by the conventional MOS process. The gate structure may comprise a gate dielectric layer 228 and an overlying gate electrode 230. Moreover, a well region 232 having the second conductivity type is formed on an upper portion of each third doping region 224a and extends into the extending portion 216 outside of the third doping region 224a. A source region 234 having the first conductivity type is formed in each well region 232 on both sides of the gate structure to complete the fabrication of the semiconductor device 20', wherein a VDMOSFET is constituted by the source region 234, the gate structure and the first doping region (which serves as a drain region) 200a.

FIGS. 4A to 4F are cross sections of yet another embodiment of a method of fabricating a semiconductor device according to the invention. Elements in FIGS. 4A to 4F that are the same as those in FIGS. 2A to 2G are labeled with the same reference numbers as in FIGS. 2A to 2G and are not described again for brevity. Referring to FIG. 4A, a substrate 200 is provided. The substrate 200 may comprise an active region A and a termination region (not shown) encircling the active region A. Moreover, the substrate 200 has a first doping region 200a and a second doping region 200b on the first doping region 200a, wherein the first and second doping regions 200a and 200b have a first conductivity type. The first and second doping regions 200a and 200b have an interface 201 therebetween. The second doping region 200b comprises a plurality of first trenches 204 therein. In one embodiment, such a structure may be formed by the fabricating steps shown in FIGS. 2A to 2B. Next, a first epitaxial layer 208' having the second conductivity type is conformably formed on the sidewall and bottom of each first trench 204 by an epitaxial growth process.

Referring to FIG. 4B, a dielectric material layer 209 is filled into each first trench 204. For example, a dielectric material layer 209, such as silicon oxide or undoped polysilicon, is formed on the substrate 200 and in each first trench 204 by a CVD process. Thereafter, the dielectric material layer 209 on the substrate 200 is removed by a CMP process.

Referring to FIG. 4C, the fabrication steps shown in FIG. 2D are performed, thereby forming a plurality of second trenches 212 in the second doping region 200b under the openings 210a of the hard mask 210. The pluralities of second and first trenches 212 and 204 are in alternate arrangement. Here, in order to simplify the diagram, only a second trench 212 and two first trenches 204 adjacent thereto are depicted.

Referring to FIG. 4D, the fabrication steps shown in FIG. 2E are performed, thereby conformably forming an insulating liner 214 on the sidewall and bottom of each second trench 212 to reduce the stresses in the second doping region 200b.

Referring to FIG. 4E, a second epitaxial layer 216' having the first conductivity type is conformably formed on the sidewall and bottom of each second trench 212 by an epitaxial growth process, wherein the fabrication method may be similar or the same as that of the first epitaxial layer 208'. Thereafter, a dielectric material layer 217 is filled into each second trench 212, wherein the dielectric material layer 217 may comprise a material and be formed by a method similar or the same as that of the dielectric material layer 209.

Referring to FIG. 4F, a gate structure is formed on each second trench 202 by the conventional MOS process. The gate structure may comprise a gate dielectric layer 228 and an overlying gate electrode 230. Moreover, a well region 232 having the second conductivity type is formed in the second doping region 200b outside of an upper portion of each first epitaxial layer 208'. A source region 234 having the first conductivity type is formed in each well region 232 on both sides of the gate structure to complete the fabrication of the semiconductor device 20'', wherein a VDMOSFET is constituted by the source region 234, the gate structure and the first doping region (which serves as a drain region) 200a.

According to the aforementioned embodiments, since the charge balance can be accomplished by controlling the doping concentrations of the N-type and P-type regions in the super junction structure that is formed by the first epitaxial layer 208/208' and the second epitaxial layer 216/216', the super junction structure can be formed in the lightly doped region (i.e., the second doping region 200b) to increase the withstand voltage of the P-N junction and prevent the turn on resistance from increasing.

Moreover, according to the aforementioned embodiments, since the super junction structure with P-type and N-type columns in an alternate arrangement can be formed in the lightly doped region by performing a epitaxial process only twice, the processes can be simplified, the manufacturing cost can be reduced, and the device size can be miniaturized.

Additionally, according to the aforementioned embodiments, an additional super junction structure may be formed on the plurality of trenches, and the withstand voltage of the P-N junction can further be increased without increasing the depth of the plurality of trenches, and the process difficulty from the etching of deep trenches can be eliminated.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
    a substrate having a first doping region and an overlying second doping region, wherein the first and second doping regions have a first conductivity type and wherein the second doping region has at least one first trench and at least one second trench adjacent thereto;
    a first epitaxial layer disposed in the first trench, having a second conductivity type;

a second epitaxial layer disposed in the second trench, having the first conductivity type, wherein the second epitaxial layer has a doping concentration greater than that of the second doping region and less than that of the first doping region; and a gate structure disposed on the second trench.

2. The semiconductor device of claim 1, wherein the second epitaxial layer further comprises an extending portion on the substrate to cover the second doping region, and wherein the extending portion has a third trench exposing the first epitaxial layer and has a third doping region adjacent to a sidewall of the third trench and having the second conductivity type.

3. The semiconductor device of claim 2, wherein the third doping region has a doping concentration greater than that of the second doping region and less than that of the first doping region.

4. The semiconductor device of claim 2, further comprising a dielectric material layer disposed in the third trench.

5. The semiconductor device of claim 4, wherein the dielectric material layer comprises silicon oxide or undoped polysilicon.

6. The semiconductor device of claim 1, wherein the first conductivity type is N-type and the second conductivity type is P-type.

7. The semiconductor device of claim 1, wherein the second doping region is formed of an epitaxial layer.

8. The semiconductor device of claim 1, wherein the first and second trenches expose an interface between the first and second doping regions.

9. The semiconductor device of claim 1, wherein the first epitaxial layer has a doping concentration greater than that of the second doping region and less than that of the first doping region.

10. The semiconductor device of claim 1, wherein the first epitaxial layer is conformably disposed on a sidewall and a bottom of the first trench and the second epitaxial layer is conformably disposed on a sidewall and a bottom of the second trench.

11. The semiconductor device of claim 10, further comprising a dielectric material layer disposed in the first and second trenches.

12. The semiconductor device of claim 11, wherein the dielectric material layer comprises silicon oxide or undoped polysilicon.

13. The semiconductor device of claim 1, wherein the gate structure is disposed on the second trench when viewed in a plan view.

14. The semiconductor device of claim 1, wherein the gate structure includes a stacked, electrode layer and a gate dielectric.

* * * * *